United States Patent
Tang et al.

(10) Patent No.: US 12,191,259 B2
(45) Date of Patent: Jan. 7, 2025

(54) MULTI-CHANNEL GATE DRIVER PACKAGE WITH GROUNDED SHIELD METAL

(71) Applicant: Texas Instruments Incorporated, Dallas, TX (US)

(72) Inventors: Yiqi Tang, Allen, TX (US); Rajen Murugan, Dallas, TX (US); Jie Chen, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 222 days.

(21) Appl. No.: 17/569,724

(22) Filed: Jan. 6, 2022

(65) Prior Publication Data
US 2023/0215811 A1 Jul. 6, 2023

(51) Int. Cl.
*H01L 23/552* (2006.01)
*H01L 23/00* (2006.01)
*H01L 23/495* (2006.01)
*H01L 25/00* (2006.01)
*H01L 25/18* (2023.01)
*H03K 17/042* (2006.01)

(52) U.S. Cl.
CPC ...... *H01L 23/552* (2013.01); *H01L 23/49503* (2013.01); *H01L 25/50* (2013.01); *H03K 17/04206* (2013.01); *H01L 23/49537* (2013.01); *H01L 23/49575* (2013.01); *H01L 24/48* (2013.01); *H01L 25/18* (2013.01); *H01L 2224/48137* (2013.01); *H01L 2224/48175* (2013.01); *H01L 2224/48247* (2013.01); *H01L 2924/30105* (2013.01)

(58) Field of Classification Search
CPC ............ H01L 23/552; H01L 23/49503; H01L 23/49537; H01L 23/49575; H01L 25/50; H01L 25/18
See application file for complete search history.

(56) References Cited

U.S. PATENT DOCUMENTS

| | | |
|---|---|---|
| 10,594,201 B2 | 3/2020 | Dubois et al. |
| 2015/0075849 A1* | 3/2015 | Yap .......................... H01L 24/43 257/676 |
| 2018/0040540 A1* | 2/2018 | Kasuya ..................... H02P 6/12 |

* cited by examiner

*Primary Examiner* — Marc Anthony Armand
(74) *Attorney, Agent, or Firm* — Ronald O. Neerings; Frank D. Cimino

(57) ABSTRACT

A multi-channel gate driver package includes a leadframe including a first, second, and third die pad. A transmitter die includes first and second transmitter signal bond pads, a first receiver die including a second signal bond pad, and a second receiver die including a third signal bond pad. A bond wire is between the first transmitter signal bond pad and the second signal bond pad, and between the second transmitter signal bond pad and third signal bond pad. A ring shield is around the respective signal bond pads. A down-bond is from the second ring shield to the second die pad, and from the third ring shield to the third die pad. A connection connects the first and second transmitter ring shield to at least one ground pin of the package. The second and third die pad each include a direct integral connection to the ground pin.

20 Claims, 6 Drawing Sheets

MULTI-CHANNEL GATE DRIVER PACKAGE WITH GROUNDED SHIELD METAL

FIELD

This Disclosure relates to multi-channel gate driver packages that have a mechanism for improving channel-to-channel isolation.

BACKGROUND

Multi-channel gate driver packages are for driving a plurality of power metal oxide semiconductor field effect transistors (MOSFET) or power insulated gate bipolar transistor (IGBT) devices, that need channel-to-channel isolation to properly operate as intended which is with independent channels (no cross coupling). In one arrangement the multi-channel gate driver package includes a transceiver die, a first receiver die, and a second receiver die, where the transceiver is electrically isolated (generally operated at a relatively low voltage) from the receiver die (generally operated at a relatively high voltage) using an isolation capacitor or isolation inductor as the isolator connected in series on or between the transceiver die and the receiver die(s) configured to block direct-current (DC) voltages from passing through to the lower voltage side, while enabling signals to pass through.

Fast switching for a high voltage or high-power gate driver package is desirable because the receiver of the gate driver package acting as a switch dissipates the most power during switching, switching meaning while in a state between being fully "off" and being fully "on". By minimizing the switching time and, therefore the heating of the gate driver package, the gate driver package can be allowed to switch more power to its application circuit, typically a power converter, such as a DC to DC converter. Fast switching is also needed to provide relatively fast rising output pulses for a variety of different applications.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize during high slew rate (dV/dt) switching operation of a multi-channel gate driver package, because the multi-channel gate driver package has capacitive coupling between its adjacent channels, such as between a first channel and a second channel in a dual-channel isolated gate driver, the capacitive coupling between the channels can create false output signals leading to erroneous gate driver package operation. Failures of multi-channel gate driver packages have been observed from standard process variation, e.g., wire sweep testing. During assembly manufacturing there is the potential for the bond wires to sweep (move) resulting in the bond wires for the respective receiver channels coming closer together as compared to the separation distance designed for, which can increase their capacitive coupling that can adversely impact the desired channel isolation requirements.

Disclosed aspects recognize the transceiver of the multi-channel gate driver package uses differential signaling to suppress common-mode coupling to the (high-voltage) HV domain. The coupling in the case of a dual-channel device occurs between the 2 receiver channels (i.e., receiver channel A and receiver channel B). Each channel is generally kept at a different potential which brings up the need for the channel isolation. Due to the manufacturing process variations, measurable noise can be coupled from receiver channel A to receiver channel B and vice-versa Common mode coupling is not a problem for a single channel multi-channel gate driver package.

However, for a multichannel device such as a dual-channel gate driver device having adjacent bond wires that go from the transmitter die to respective receiver die, the differential signaling can appear as residual signals on an adjacent channel when the two receiver channels switch separately, causing erroneous multi-channel gate driver package operation. The recognized root cause of this cross-channel coupling is the high sensitivity to mutual (parasitic) capacitance coupling between the receiver channels resulting from the adjacent bond wires between the transmitter die and the respective receiver die. In the case of a dual channel device, there are 2 receiver die, a first receiver die on channel A [RXA] and a second receiver die on channel B [RXB] and the leadframe which is between the adjacent bondwires that can cause channel cross coupling. Reducing the package mutual capacitance without changing the position of the bondwires is how disclosed aspects address this cross-coupling problem.

Disclosed aspects include multi-channel gate driver packages with added grounded shield metal that reduces this mutual capacitance between adjacent receiver channels resulting in a reduced level of channel-to-channel cross coupling. The grounded shield metal includes what is termed herein a ring shield that can use the same top metal layer that is used for the bond pads on the die positioned around the bond pads on each of the die that are involved in the connections between the transmitter die and the respective receiver die. The bond pads involved in these connections are referred to herein as being signal bond pads. The ring shield on the receiver die includes a downbond (a wirebond) to the respective die pad for each of these die, where the respective die pads are each directly shorted to a ground pin of the package. The ring shield can also be on the transmitter die when the transmitter die includes a peninsula shaped metal region extending from the die pad of the transmitter die, where the peninsula shaped region includes downbonds to the ring shield on the transmitter die to further improve shielding and thus further reduce cross channel capacitive coupling.

Disclosed aspects include a multi-channel gate driver package comprising a leadframe including first, second, and third die pad. A transmitter die includes first and second transmitter signal bond pads, a first receiver die including a second signal bond pad, and a second receiver die including a third signal bond pad. A bond wire is between the first transmitter signal bond pad and the second signal bond pad, and between the second transmitter signal bond pad and third signal bond pad. A ring shield on each die is positioned around the respective signal bond pads. A downbond is from the second ring shield to the second die pad, and from the third ring shield to the third die pad. There is a connection connecting the first and second transmitter ring shields to at least one ground pin selected from the plurality of leads. The second and third die pad each include a direct integral connection to a ground pin.

Disclosed grounded ring shields have been found to reduce the problem of a gate driver channel glitch and wire sweep sensitivity, both due to a reduction in cross channel capacitive coupling. Disclosed aspects do not add any circuitry to any of the die of the multichannel gate driver package. As used herein, a 'ring', such as when used in the term ring shield, means an enclosed shape that encloses a signal die pad, such as being circular or substantially circular, elliptical, rectangular, or square shaped.

BRIEF DESCRIPTION OF THE DRAWINGS

Reference will now be made to the accompanying drawings, which are not necessarily drawn to scale, wherein.

DETAILED DESCRIPTION

Figure 1:
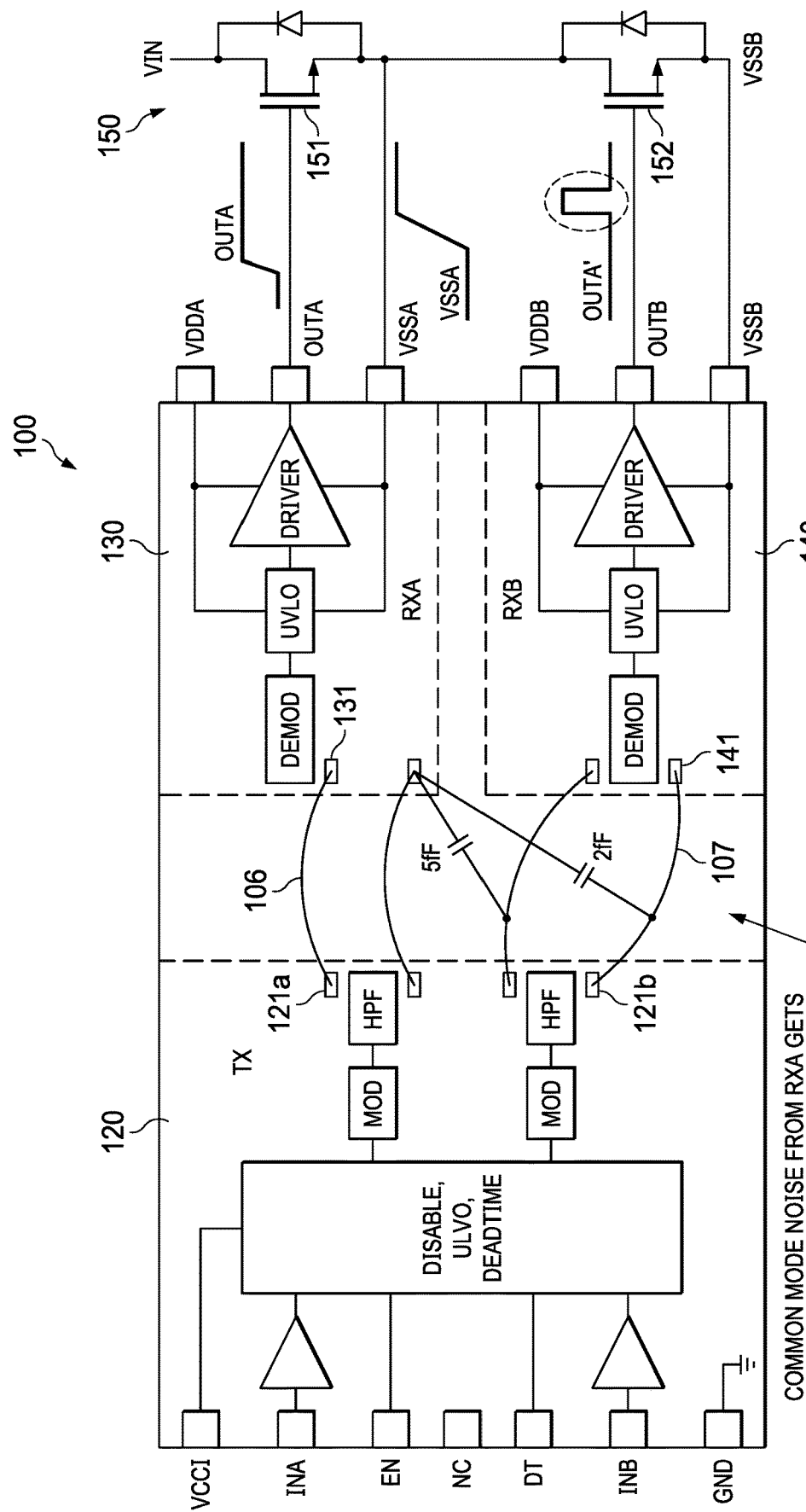
FIG. 1 depicts a block diagram representation of a known dual—channel gate driver package showing signal bond wires from signal bond pads on the transceiver die to signal bond pads on the first receiver die, and other signal bond wires from other signal bond pads on the transceiver die to signal bond pads on the second receiver die. The respective receiver die are each shown driving the gate of a power NMOS transistor of a power NMOS device that is the power transistor part of a power converter circuit. Due to cross coupling associated with the mutual capacitance (with example values of mutual capacitance shown) between the respective signal bond wires associated with the respective channels, some of the signal for the first channel shown as channel A outputted by the package pin OUTA when channel A is active, is also present on the second channel driven by the second receiver die shown as channel B on the package pin OUTB shown being a square wave as OUTA', when channel B should instead be inactive (and thus have no signal on this pin due to no signal coming from the transmitter die).

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

FIG. 1 depicts a block diagram representation of a known dual—channel gate driver package 100 showing signal bond wires 106 from first transmitter signal bond pads 121a on the transceiver die 120 to signal bond pads 131 on the first receiver die 130, and other signal bond wires 107 from second transmitter signal bond pads 121b also on the transceiver die 120 to signal bond pads 141 on the second receiver die 140. Although not shown, as noted above in the background there is an isolation device generally comprising an isolation capacitor or isolation inductor connected in series on or between the transceiver die 120 and the respective receiver die 130, 140. The respective die 130, 140 are all on separate die pads (not shown).

The respective receiver die 130, 140 are each shown driving the gate of a power NMOS transistor 151, 152 of a power NMOS device 150 that is the power transistor part of a power converter circuit, where the respective power NMOS transistors 151, 152 are connected in series. Due to cross coupling associated with the mutual capacitance (with example values of mutual capacitance shown) between the signal bond wires 106 and signal bond wires 107 associated with the respective channels, some of the signal for the first channel shown as channel A outputted by the package pin OUTA when channel A is active, also is present on the second channel driven by the second receiver die shown as channel B on the package pin OUTB shown being a square wave as OUTA', when the output of channel B should instead be inactive (and thus have no signal on this pin due to no signal coming from the transmitter die).

Figure 2:
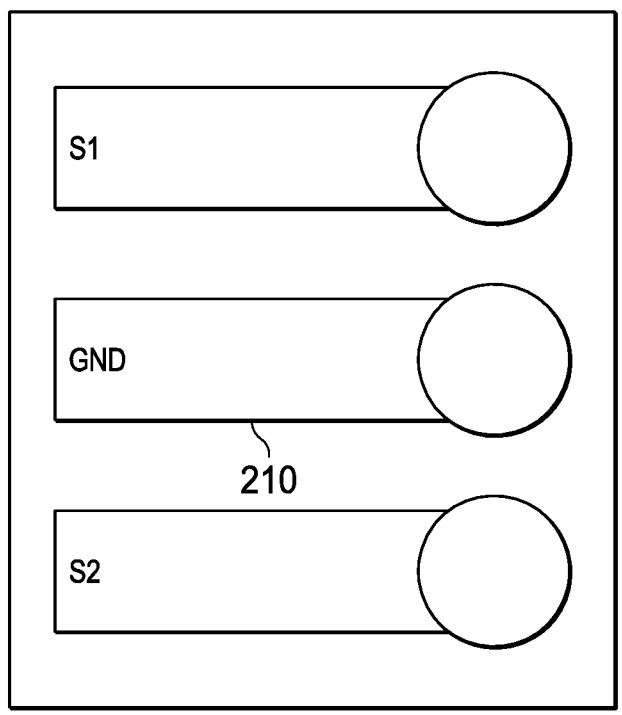
FIG. 2 depicts a disclosed grounded shield metal feature shown in a simplified form as a trace (the trace/guard metal feature is labeled as being grounded but is not shown grounded which it will be) that is located between two adjacent metal features shown as S1 and S2 that can each represent bond wires. The trace being grounded and positioned between S1 and S2 reduces the mutual capacitance between the adjacent metal features S1 and S2.

FIG. 2 depicts a disclosed grounded shield metal feature shown in a simplified form as a trace 210 (the trace/guard metal feature is labeled as being grounded but is not shown grounded which it will be) that is located between two adjacent metal features shown as S1 and S2 that can each represent bond wires. The trace 210 being grounded and positioned between S1 and S2 reduces the mutual capacitance between the adjacent metal features S1 and S2.

Figure 3A:
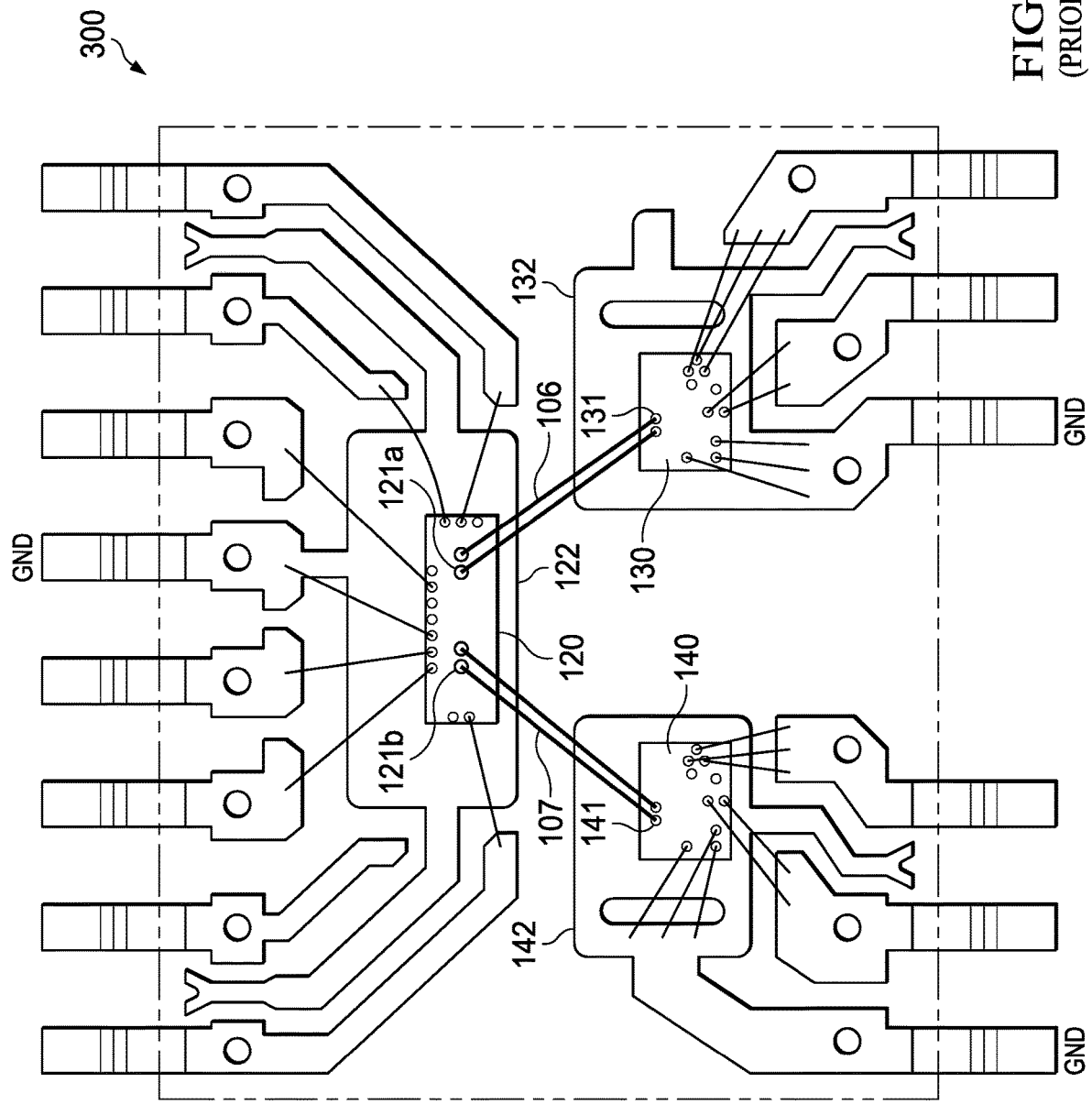
FIG. 3A shows a known dual channel gate driver package that lacks any disclosed grounded ring shield. The transmitter die is mounted on a first die pad, the first receiver die is mounted on a second die pad, and the second receiver die is mounted on a third die pad. The signal bond pads and the die—to—die connections are the same as shown in FIG. 1.

FIG. 3A shows a known dual channel gate driver package 300 that lacks any disclosed grounded ring shield. The transmitter die 120 is mounted on a first die pad 122, the first receiver die 130 is mounted on a second die pad 132, and the second receiver die 140 is mounted on a third die pad 142. The signal bond pads and the die-to-die connections are the same as shown in FIG. 1.

Figure 3B:
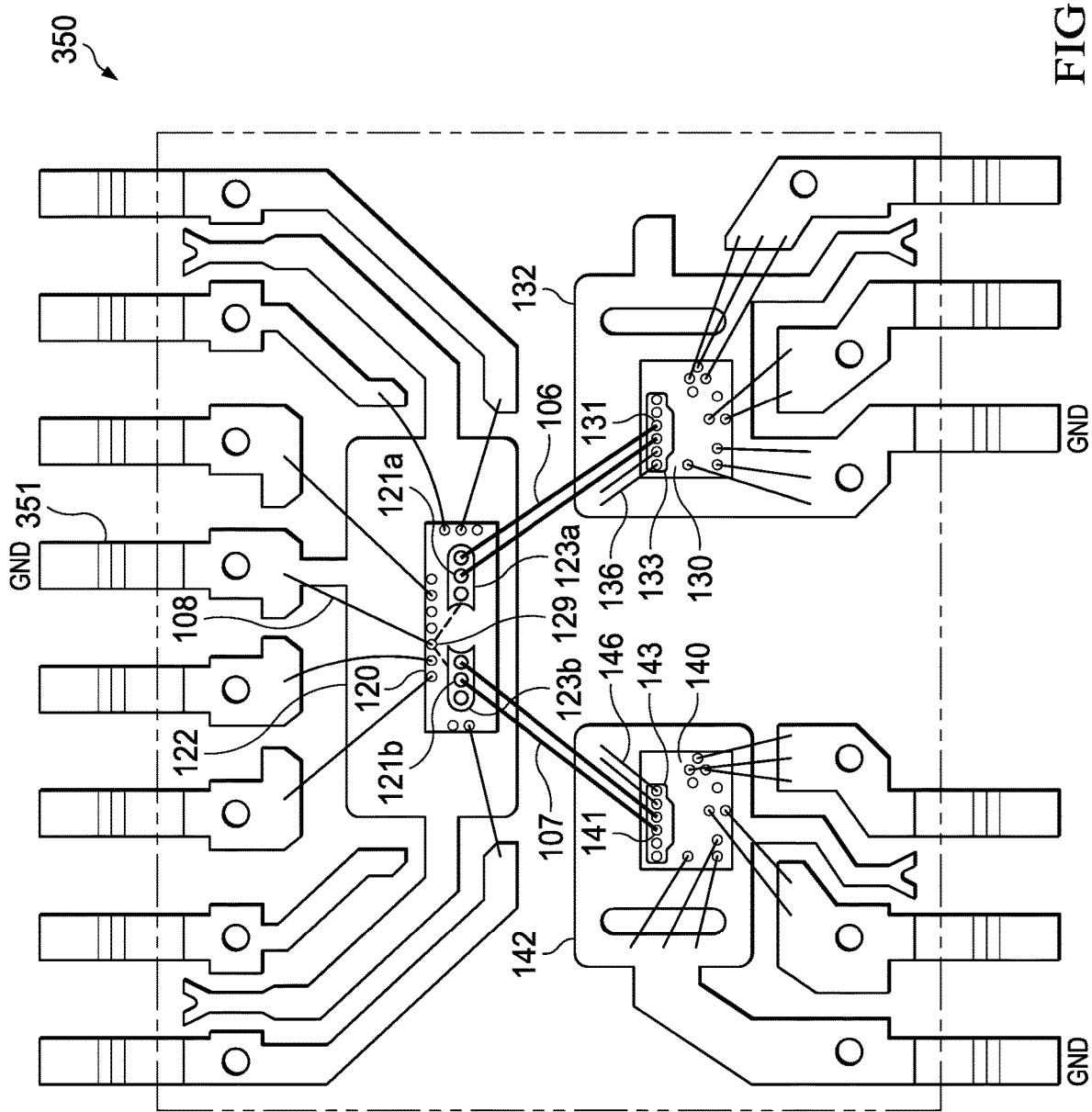
FIG. 3B shows a disclosed dual channel gate driver package that includes a disclosed grounded ring shield for each of the respective die including the first receiver die, a ring shield for the second receiver die, and first and second transmitter ring shields for the transmitter die, that each encircle their respective signal bond pads. The respective die pads are each shorted to the ground pin(s) of the dual channel gate driver package.

FIG. 3B shows a disclosed dual channel gate driver package 350 that includes a disclosed grounded ring shield for each of the respective die 120, 130, 140 including the first receiver die 130 shown as 133, the ring shield for the second receiver die 140 shown as 143, and first and second transmitter ring shields shown as 123a and 123b for the transmitter die 120, that each encircle their respective signal bond pads. Although the ring shields all encircle their associated signal bond pads, they do not in any way physically touch them to provide electrical isolation. Disclosed gate driver packages can have more than two channels.

There are signal bond wires 106 from the first transmitter signal bond pad 121a on the transmitter die 120 to signal bond pads 131 on the first receiver die 130, and signal bond wires 107 from the second transmitter signal bond pads 121b on the transmitter die 120 to signal bond pad 141 on the second receiver die 140. There is also a downbond 136 between the ring shield 133 and the die pad 132 on the first receiver die 130, and a downbond 146 between the ring shield 143 and the die pad 142 on the second receiver die 140. There is also a bond wire 108 between a bond pad 129 on the transmitter die 120 that is electrically connected to the ring shields 123a and 123b by an integral metal connection depicted by a line, where the bond pad 129 is shown connected by the bond wire 108 to a GND leadframe pin shown as 351 for grounding the ring shields 123a and 123b. Bond pad 129 may be referred to as being a grounding bond pad. The ring shield 123b, although not shown, can be connected to a separate grounding bond pad that includes a separate bond wire to a GND leadframe pin 351 or a another GND pin.

The leadframe is configured so that the respective die pads 122, 132, 142 are each shorted by a direct integral connection to a separate ground pin, shown as GND, for the dual channel gate driver package 350, although it may be possible for a single GND pin to be used. The capacitive coupling between the respective channels caused by the adjacent signal bond wires 106 and 107 associated with these channels is reduced because the ring shields being grounded absorb some of the E-field coupling that would otherwise be present. A minimum width of each of the ring shields 123a, 123b, 133, 143 can be at least 2 times a dimension of the respective signal bond pads 121a, 121b, 131, 141. A maximum width of these ring shields can cover the whole surface of the respective die 120, 130 and 140 (with clearance of the signal die pads). A minimum spacing between the signal bond wires 106 and 107 can be equal to a pitch between the first, the second, and the third die pads. The maximum spacing between the signal bond wires 106, 107 can depend on the die layout, the die size and the manufacturing process. The leadframe for disclosed aspects may be formed using a process comprising etching or stamping.

Figure 3C:
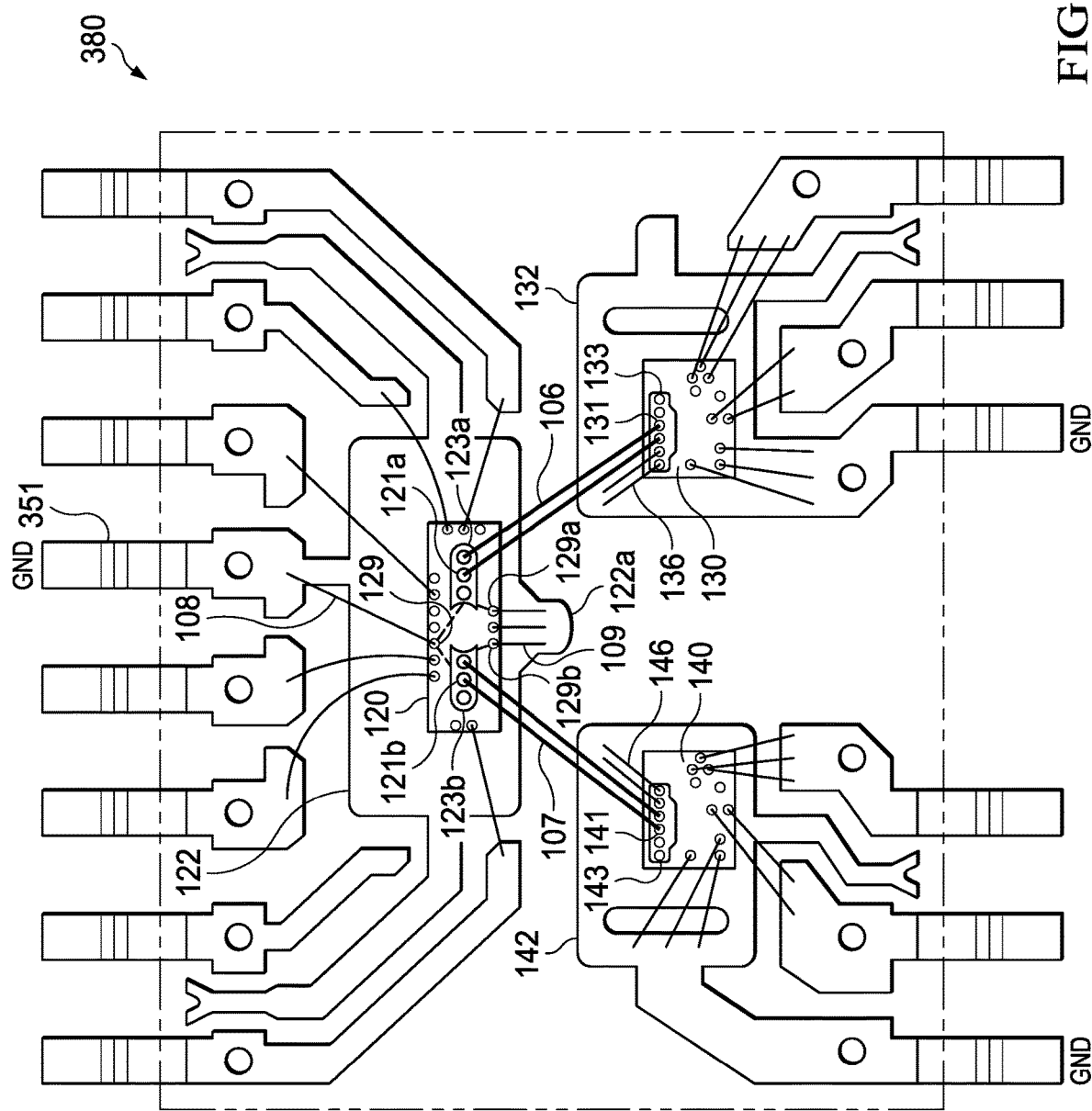
FIG. 3C shows an example dual channel gate driver package that includes the ring shields and receiver die downbonds shown in FIG. 3B, and further includes a disclosed grounded peninsula shaped feature being an extension of the die pad of the transmitter die.

FIG. 3C shows an example dual channel gate driver package 380 that includes the ring shields and downbonds shown in FIG. 3B, and further includes a disclosed grounded peninsula shaped feature 122a being an extension of the first die pad 122 of the transmitter die 120. There are also downbonds shown as 109 from bond pads 129a (that may be referred to as being grounding bond pads) on the transmitter die 120 that are part of the respective ring shields 123a, 123b generally by an integral metal connection, with this electrical connection shown represented by a line from the bond pads 129a and 129b to the respective ring shields 123a, 123b.

The peninsula shaped feature 122a extends into the region between the respective die pads 132, 142 of the respective receiver die 130, 140 for a portion of the distance between the second and third die pads 132, 142 of the respective receiver die 130, 140 and the first die pad 122 of the transmitter die 120. The peninsula shaped feature 122a can extend all the way to be even with the outer edge of the second and third die pads 132, 142 for the respective receiver die 130, 140 provided the minimum metal to metal spacing between the transmitter die 120 and the respective receiver die 130, 140 provided high-voltage isolation is maintained.

EXAMPLES

Disclosed aspects are further illustrated by the following specific Examples, which should not be construed as limiting the scope or content of this Disclosure in any way.

Figures 4A, 4B:
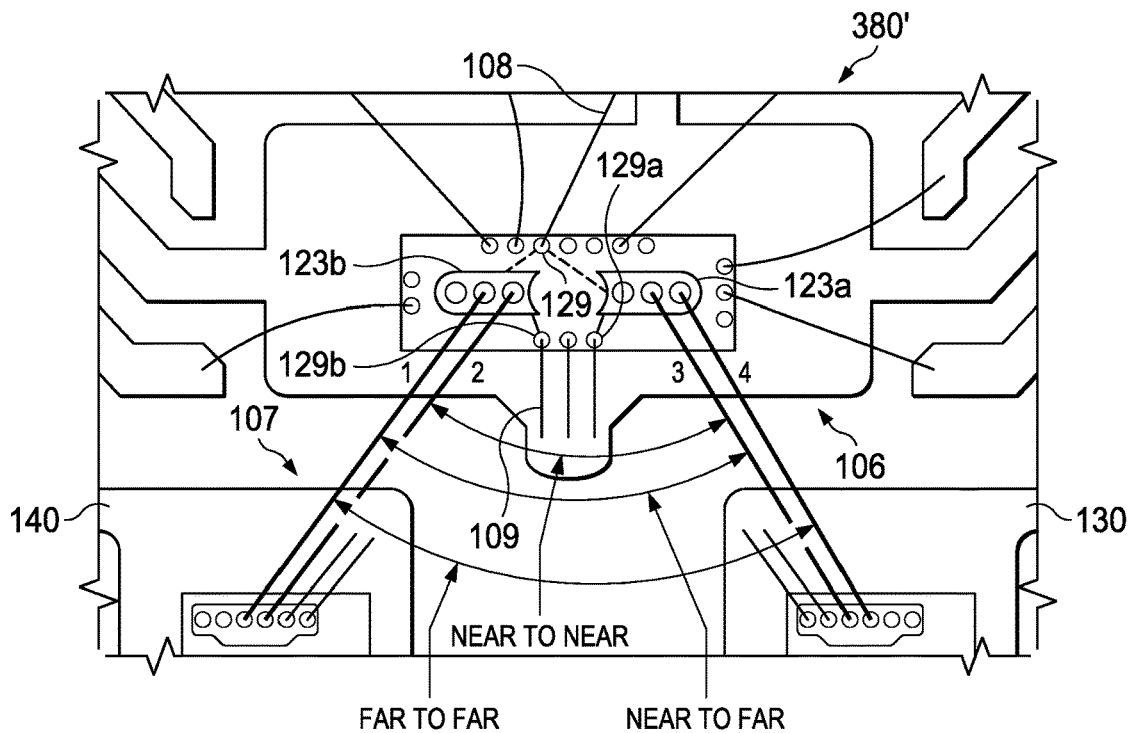
FIG. 4A shows simulated mutual capacitance data for the dual channel gate driver package shown in FIG. 3B and for the dual channel gate driver package shown in FIG. 3C. This data evidences a reduction in mutual capacitance of about 40% and 50% respectively between the signal bond wires.
FIG. 4B shows simulated data for the dual channel gate driver package shown in FIG. 3C evidencing a wire sweep immunity improvement being a 2× reduction in total differential capacitive coupling being provided.

FIG. 4A shows simulated data for mutual capacitance for the dual channel gate driver package 350 shown in FIG. 3B and for the dual channel gate driver package 380 shown in FIG. 3C. A simplified depiction for the dual channel gate driver package 380 is shown as 380' now with identification of the signal bond wires 107 as 1, and 2 and the signal bond 106 as 3 and 4 which is used in the tables for all the packages 300, 350 and 380 provided in FIG. 4A and 4B. This data evidences a reduction in mutual capacitance of about 40% and 50% respectively between the signal bond wires 106, and 107.

In the wire sweep immunity test, wire sweep happens during IC packaging assembly processing when the mold compound is injected into the mold chase, where the flow of the mold compound causes the sweep of bond wires, sometimes resulting in shorts or in this case, additional coupling of the bond wires degrading device performance. This test ensures that the sweep is within an acceptable range. FIG. 4B shows simulated data for the dual channel gate driver package 380 shown in FIG. 3C as compared to the dual channel gate driver package 300 shown in FIG. 3A evidencing a wire sweep immunity improvement being a 2× reduction in total differential capacitive coupling provided following wire sweep testing.

Disclosed aspects can be integrated into a variety of assembly flows to form a variety of different semiconductor packages and related products. The semiconductor package can comprise single IC die or multiple IC die, such as configurations comprising a plurality of stacked IC die, or laterally positioned IC die. A variety of package substrates may be used. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:
1. A multi-channel gate driver package, comprising:
a leadframe including a plurality of leads and a first die pad, a second die pad, and a third die pad;
a transmitter die attached to the first die pad, the transmitter die including first circuitry electrically connected to bond pads on the transmitter die including a first transmitter signal bond pad and a second transmitter signal bond pad;
a first receiver die attached to the second die pad, the first receiver die including second circuitry electrically connected to bond pads on the first receiver die including a first receiver signal bond pad;

a second receiver die attached to the third die pad, the second receiver including third circuitry electrically connected to bond pads on the second receiver including a second receiver signal bond pad;

a first bond wire between the first transmitter signal bond pad and the first receiver signal bond pad, and a second bond wire between the second transmitter bond pad and the second receiver signal bond pad;

a first ring shield and a second ring shield on the transmitter die positioned around the first and the second transmitter signal bond pads, respectively, a third ring shield on the first receiver die positioned around the first receiver signal bond pad, and a fourth ring shield on the second receiver die positioned around the second receiver signal bond pad;

a downbond from the third ring shield to the second die pad, and from the fourth ring shield to the third die pad;

a connection electrically connecting the first and second transmitter ring shields to at least one ground pin selected from the plurality of leads;

wherein the second die pad and the third die pad each include a direct integral connection to the ground pin.

2. The multi-channel gate driver package of claim 1, wherein the first die pad includes the direct integral connection.

3. The multi-channel gate driver package of claim 1, further comprising a peninsula shaped region extending from the first die pad at least a portion of a distance to the second die pad and the third die pad, wherein the transmitter bond pads further includes a first grounding bond pad electrically connected to the first transmitter ring shield and second grounding bond pad electrically connected to the second transmitter ring shield, and wherein there is at least one downbond between the first grounding bond pad and the peninsula shaped region, and at least one downbond between the second grounding bond pad and the peninsula shaped region.

4. The multi-channel gate driver package of claim 3, wherein the peninsula shaped region extends from the first die pad at least 50% of a distance to the second die pad and to the third die pad.

5. The multi-channel gate driver package of claim 1, wherein the first ring shield, the second ring shield, and the third ring shield are all formed from a top metal layer also used for the transmitter bond pads, the second bond pads, and the third bond pads, respectively.

6. The multi-channel gate driver package of claim 1, wherein a minimum width of the first and second ring shields, the third ring shield, and the fourth ring shield are all at least 2 times a dimension of the first transmitter signal bond pad, the second transmitter signal bond pad, the second signal bond pad, and the third signal bond pad, respectively.

7. The multi-channel gate driver package of claim 1, wherein the first signal bond wire and the second signal bond wire both comprise a plurality of bond wires.

8. The multi-channel gate driver package of claim 1, wherein a minimum spacing between the first bond wire and the second bond wire is equal to a pitch between the first, the second and the third die pads.

9. A method of forming a multi-channel gate driver package, comprising:

attaching a transmitter die to a first die pad, the transmitter die including first circuitry electrically connected to bond pads on the transmitter die including a first transmitter signal bond pad and a second transmitter signal bond pad;

attaching a first receiver die to a second die pad, the first receiver including second circuitry electrically connected to a second bond pad including a second signal bond pad;

attaching a second receiver die to a third die pad, the second receiver die including third circuitry electrically connected to third bond pads including a third signal bond pad on the third die pad;

forming a first bond wire between the first transmitter signal bond pad and the second signal bond pad, and a second bond wire between the second transmitter signal bond pad and the signal third bond pad;

forming a top metal layer including a first ring shield and a second ring shield on the transmitter die;

forming a third ring shield on the first receiver die, and a fourth ring shield on the second receiver die positioned around the first, second, and the third signal bond pads, respectively;

wirebonding to form a downbond from the third ring shield to the second die pad, and from the fourth ring shield to the third die pad;

forming a connection electrically connecting the first and second ring shields to at least one ground pin selected from the plurality of leads; and wherein the second die pad and the third die pad, each include a direct integral connection to the ground pin.

10. The method of claim 9, further comprising forming the leadframe using a process comprising etching or stamping.

11. The method of claim 9, wherein the first die pad includes the direct integral connection.

12. The method of claim 9, wherein the multi-channel gate driver package further comprises a peninsula shaped region extending from the first die pad at least a portion of a distance to the second die pad and the third die pad, and wherein the transmitter bond pads further includes a first grounding bond pad electrically connected to the first transmitter ring shield and a second grounding bond pad electrically connected to the second transmitter ring shield, forming at least one downbond between the first grounding bond pad and the peninsula shaped region providing an electrical connection between the first ring shield and the peninsula shaped region and from the second grounding bond pad and the peninsula shaped region providing an electrical connection between the second ring shield and the peninsula shaped region.

13. The method of claim 12, wherein the peninsula shaped region extends from the first die pad at least 50% of a distance to the second die pad and to the third die pad.

14. The method of claim 9, wherein the first ring shield, the second ring shield, the third ring shield and the fourth ring shield are all formed from a top metal layer also used for the transmitter bond pads, the second bond pads, and the third bond pads, respectively.

15. The method of claim 9, wherein a minimum width of the first and second ring shields, the third ring shield, and the fourth ring shield are all at least 2 times a dimension of the first transmitter signal bond pad, the second transmitter signal bond pad, the second signal bond, and the third signal bond pad, respectively.

16. The method of claim 9, wherein the first signal bond wire and the second signal bond wire both comprise a plurality of bond wires.

17. The method of claim 9, wherein a minimum spacing between the first bond wire and the second bond wire is equal to a pitch between the first, the second and the third die pads.

18. A multi-channel gate driver package, comprising:
a leadframe including a plurality of leads and a first die pad, a second die pad, and a third die pad;
a transmitter die including first circuitry electrically connected to transmitter bond pads including a first transmitter signal bond pad and a second transmitter signal bond pad both on the first die pad, a first receiver die including second circuitry electrically connected to second bond pads including a on the second die pad, and a second receiver die including third circuitry electrically connected to third bond pads including at least one third signal bond pad on the third die pad;
a first bond wire between the first transmitter signal bond pads and the second signal bond pad, and a second bond wire between the second transmitter signal bond pad and the third signal bond pad;
a first and a second ring shield on the transmitter die positioned around the first transmitter signal bond pad and the second transmitter signal bond pad, respectively, a third ring shield on the first receiver die positioned around the second signal bond pad, and a fourth ring shield on the second receiver die positioned around the third signal bond pad, and
a downbond from the third ring shield to the second die pad, and from the fourth ring shield to the third die pad, and
a connection connecting the first and second transmitter ring shield to at least one ground pin selected from the plurality of leads,
wherein the second die pad and the third die pad each include a direct integral connection to the ground pin, and
a peninsula shaped region extending from the first die pad at least a portion of a distance to the second die pad and the third die pad, wherein the transmitter bond pads further includes a first grounding bond pad electrically connected to the first ring shield and second grounding bond pad electrically connected to the second ring shield, and wherein there is at least one downbond between the first grounding bond pad and the peninsula shaped region, and at least one downbond between the second grounding bond pad and the peninsula shaped region,
wherein the first die pad includes the direct integral connection.

19. The multi-channel gate driver package of claim 18, wherein a minimum width of the first and second ring shields, the third ring shield, and the fourth ring shield are all at least 2 times a dimension of the first transmitter signal bond pad, the second transmitter signal bond pad, the second signal bond pad, and the third signal bond pad, respectively.

20. The multi-channel gate driver package of claim 18, wherein the first ring shield, the second ring shield, the third ring shield and the fourth ring shield are all formed from a top metal layer also used for the transmitter bond pads, the second bond pads, and the third bond pads, respectively.

* * * * *